(12) United States Patent
Ting et al.

(10) Patent No.: US 12,482,778 B2
(45) Date of Patent: Nov. 25, 2025

(54) ELECTRONIC DEVICE AND METHOD OF FABRICATING AN ELECTRONIC DEVICE

(71) Applicant: Innolux Corporation, Miao-Li County (TW)

(72) Inventors: Chin-Lung Ting, Miao-Li County (TW); Ker-Yih Kao, Miao-Li County (TW); Cheng-Chi Wang, Miao-Li County (TW); Kuang-Ming Fan, Miao-Li County (TW); Chun-Hung Chen, Miao-Li County (TW); Wen-Hsiang Liao, Miao-Li County (TW); Ming-Hsien Shih, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 468 days.

(21) Appl. No.: 17/746,987

(22) Filed: May 18, 2022

(65) Prior Publication Data

US 2023/0129218 A1 Apr. 27, 2023

(30) Foreign Application Priority Data

Oct. 22, 2021 (CN) .......................... 202111233917.2

(51) Int. Cl.
*H01L 23/00* (2006.01)

(52) U.S. Cl.
CPC .............. *H01L 24/19* (2013.01); *H01L 24/20* (2013.01); *H01L 2224/215* (2013.01); *H01L 2924/3511* (2013.01)

(58) Field of Classification Search
CPC ... H01L 24/19; H01L 24/20; H01L 2224/215; H01L 2924/3511
See application file for complete search history.

(56) References Cited

U.S. PATENT DOCUMENTS

| 11,569,175 B2* | 1/2023 | Mun ....................... H01L 24/19 |
| 2002/0055256 A1 | 5/2002 | Jiang |

(Continued)

FOREIGN PATENT DOCUMENTS

| CN | 108122861 | 6/2018 |
| CN | 114384768 | 11/2023 |

(Continued)

OTHER PUBLICATIONS

"Office Action of Taiwan Counterpart Application", issued on Mar. 20, 2023, pp. 1-9.

(Continued)

*Primary Examiner* — Jacob Y Choi
*Assistant Examiner* — Neil R Prasad
(74) *Attorney, Agent, or Firm* — JCIPRNET

(57) ABSTRACT

An electronic device including a connection element is provided. The connection element includes a first insulation layer and a second insulation layer. The first insulation layer has a first opening. A sidewall of the first insulation layer at the first opening has roughness different from roughness of a top surface of the first insulation layer. The second insulation layer is disposed on the first insulation layer, and the second insulation layer has a second opening. The sidewall of the first insulation layer at the first opening is exposed by the second opening. A method of fabricating an electronic device is also provided.

9 Claims, 7 Drawing Sheets

(56) References Cited

U.S. PATENT DOCUMENTS

| | | | | |
|---|---|---|---|---|
| 2004/0217483 | A1* | 11/2004 | Hedler | H01L 25/0657 257/774 |
| 2006/0024939 | A1* | 2/2006 | Grunow | H01L 21/2855 438/596 |
| 2014/0353789 | A1* | 12/2014 | Oganesian | H10F 39/8063 257/434 |
| 2015/0008020 | A1* | 1/2015 | Kaneko | H05K 3/465 174/250 |
| 2015/0235845 | A1 | 8/2015 | Sekita et al. | |
| 2018/0096952 | A1* | 4/2018 | Miccoli | H01L 23/562 |
| 2022/0020590 | A1* | 1/2022 | Lei | H01L 21/6776 |
| 2022/0344278 | A1* | 10/2022 | Yamaguchi | H01L 23/544 |

FOREIGN PATENT DOCUMENTS

| | | |
|---|---|---|
| JP | 2017073514 | 4/2017 |
| TW | 201008411 | 2/2010 |
| TW | 201230901 | 7/2012 |
| TW | 201722214 | 6/2017 |

OTHER PUBLICATIONS

"Search Report of Europe Counterpart Application", issued on Mar. 13, 2023, pp. 1-9.
"Office Action of China Counterpart Application", issued on Jul. 10, 2025, p. 1-p. 7.

* cited by examiner

ELECTRONIC DEVICE AND METHOD OF FABRICATING AN ELECTRONIC DEVICE

CROSS-REFERENCE TO RELATED APPLICATION

This application claims the priority benefit of China application serial no. 202111233917.2, filed on Oct. 22, 2021. The entirety of the above-mentioned patent application is hereby incorporated by reference herein and made a part of this specification.

BACKGROUND

Technical Field

The disclosure relates to an electronic device and a method of fabricating an electronic device.

Description of Related Art

In a process of fabricating an electronic device, due to different physical properties of different materials, such as a coefficient of thermal expansion, warpage of products caused by the difference is an issue that has to be addressed.

SUMMARY

The disclosure provides an electronic device with good quality.

The disclosure provides a method of fabricating an electronic device capable of effectively avoiding warpage in a fabricating process of the electronic device.

According to the embodiment of the disclosure, an electronic device includes a connection element. The connection element includes a first insulation layer and a second insulation layer. The first insulation layer has a first opening. A sidewall of the first insulation layer at the first opening has roughness different from roughness of a top surface of the first insulation layer. The second insulation layer is disposed on the first insulation layer, and the second insulation layer has a second opening. The sidewall of the first insulation layer at the first opening is exposed by the second opening.

According to the embodiment of the disclosure, a method of fabricating an electronic device includes the following. A substrate is provided. A first insulation layer is formed on the substrate. The first insulation layer is patterned to form a first opening. A second insulation layer is formed on the first insulation layer. The second insulation layer extends to the first opening, and in a cross-sectional view, a width of a lower bottom of the first opening is less than a width of an upper bottom of the first opening.

According to the embodiment of the disclosure, a method of fabricating an electronic device includes the following. A substrate is provided. A first insulation layer is formed on the substrate. The first insulation layer is patterned to form a first opening. A second insulation layer is formed on the first insulation layer. The second insulation layer is patterned to form a second opening corresponding to the first opening. In a cross-sectional view, a width of a lower bottom of the first opening is less than a width of an upper bottom of the first opening, and the width of the upper bottom of the first opening is less than a width of a lower bottom of the second opening.

In order to make the aforementioned features and advantages of the disclosure comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
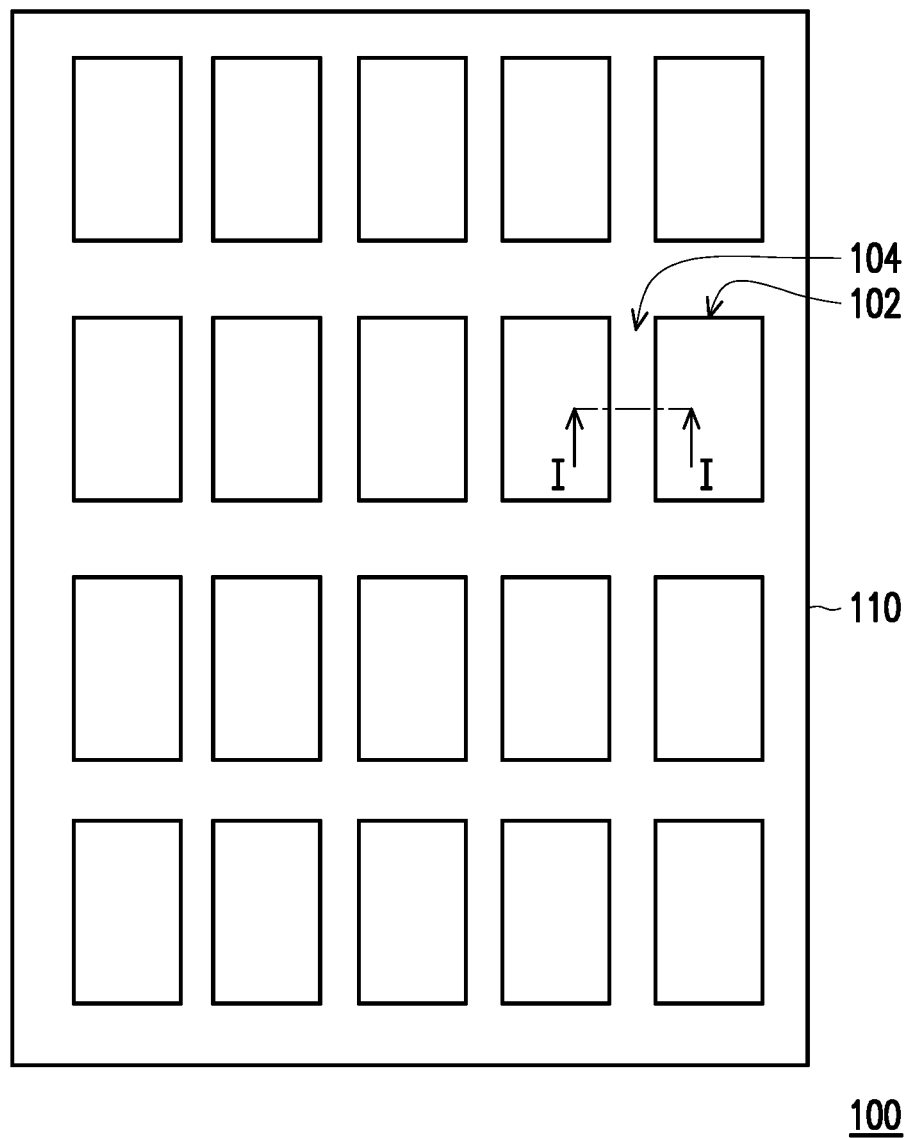
FIG. 1 is a schematic diagram of an electronic device according to an embodiment of the disclosure.

Reference will now be made in detail to the present exemplary embodiments of the disclosure, examples of which are illustrated in the accompanying drawings. Wherever possible, the same reference numerals are used in the drawings and the description to refer to the same or like parts.

In the following specification and claims, words such as "including", "containing", and "having" are open-ended words, so they should be interpreted as meaning "containing but not limited to . . . ".

A structure (or layer type, component, substrate) being located on/above another structure (or layer type, element, substrate) or a structure (or layer type, component, substrate) being connected to another structure (or layer type, element, substrate) described in this disclosure may refer to two structures being adjacent and directly connected to each other, or may refer to two structures being adjacent but not directly connected to each other. An indirect connection means that there is at least one intermediary structure (or intermediary layer, intermediary component, intermediary substrate, or intermediary interval) between two structures, and the lower lateral surface of a structure is adjacent or directly connected to the upper lateral surface of an intermediary structure, and the upper lateral surface of another structure is adjacent or directly connected to the lower lateral surface of the intermediary structure. The intermediary structure may be a monolayer or multi-layer physical structure or a non-physical structure, and the disclosure is not limited thereto. In this disclosure, when a structure is "above" another structure, it may mean that a certain structure is "directly" on another structure, or that a certain structure is "indirectly" on another structure, that is, there is at least one structure between said certain structure and said another structure.

Although the terms "first", "second", "third" . . . may be used to describe various constituent elements, the constituent elements are not limited to these terms. These terms are only used to distinguish a single constituent element from other constituent elements in the specification. The same terms may not be used in the claims, and may be replaced with first, second, third . . . according to a declared order of the elements in the claims. Accordingly, in following description of the specification, the first constituent element may be the second constituent element in the claims.

In the specification, the terms "about", "around", "substantial", and "approximate", generally refers to be within 10%, or within 5%, or within 3%, or within 2%, or within 1%, or within 0.5% of a given value or range. The quantity given here is an approximate quantity, i.e., in the absence of a specific description of "about", "around", "substantial", and "approximate", the meanings of "about", "around", "substantial", and "approximate" may still be implied. Moreover, the terms "a range from a first value to a second value" and "a range between a first value and a second value" indicate that the range includes the first value, the second value, and other values in between.

The terms "electrically connect" and "couple" described in the disclosure include any direct and indirect electrical connection. In a case of direct electrical connection, end points of two circuits are directly connected or connected to each other with a conductive line. In a case of indirect electrical connection, there is a switch, a diode, a capacitor, inductance, a resistor, or other suitable component, or a combination of the components above between the end points of the two circuits; however, the disclosure is not limited thereto.

In the disclosure, the thickness, the length, and the width may be measured by an optical microscope, and the thickness may be measured based on a cross-sectional image in an electron microscope, but the disclosure is not limited thereto. In addition, there may be a certain error between any two values or directions used for comparison. When a first value is equal to a second value, it implies that there may be an error of 10%, 5%, or 3% between the first value and the second value.

It should be noted that the embodiments listed below can replace, recombine, and mix features in several different embodiments to achieve other embodiments without departing from the principle of the disclosure. The features of the embodiments may be arbitrarily mixed and combined as long as they do not depart from or conflict with the spirit of the disclosure.

FIG. 1 is a schematic diagram of an electronic device according to an embodiment of the disclosure. In some embodiments, the electronic device 100 may be a high frequency element, a light emitting element, a display device, a titled device, a packaging device, and the like. In some embodiments, the electronic device 100 may be flexible or foldable. An electronic device 100 has multiple element areas 102 and multiple non-element areas 104. The element areas 102 are arranged into an array and are separated from each other, and the non-element areas 104 are distributed among the element areas 102. In some embodiments, at least a chip, a redistribution layer, and a packaging material are provided in the element areas 102. The chip may be a light emitting chip, a semiconductor chip, and the like. In some embodiments, the semiconductor chip may define an electronic circuit combined with an active element, a passive element, or a combination thereof, such as a logic circuit, a memory circuit, and the like. In some embodiments, the electronic device 100 may be a high-frequency element, a light emitting element, a packaging element, and the like. The non-element areas 104 may include scribe lines, and multiple independent electronic devices of the electronic device 100 may be separated along the scribe lines. In some embodiments, after cutting, a structure of the non-element areas 104 may be partially kept in the independent electronic devices or may not be present in the independent electronic devices.

In some embodiments, an individual component in the electronic device 100 is mainly supported by a substrate 110. In addition, a required connection element may be fabricated on the substrate 110 to realize required electrical connection of each component. Here, the connection element may be viewed as a redistribution layer; however, the disclosure is not limited thereto. The substrate 110 may be a glass substrate, a silicon substrate, a sapphire substrate, and the like, and have a panel level size. For example, the substrate 110 may be a G3.5 glass substrate with a size of 610 mm×720 mm; however, the disclosure is not limited thereto. In other embodiments, the substrate 110 may be a G3 glass substrate, a G4 glass substrate, a G4.5 glass substrate, a G5 glass substrate, a G5.5 glass substrate, or a glass substrate of further generation. In the embodiment, the chip is connected to the panel level substrate. The redistribution layer is fabricated on the panel level substrate, and the chip is packaged. Hence, the embodiment may serve as an application of fan out panel level packaging (FOPLP). Since the panel level substrate 110 is adopted in the fan out panel level packaging process, compared to wafer level packaging, the productivity may be greatly increased. At the same time, the panel level substrate 110 has a rectangle outline, compared to wafer level packaging, the utilization ratio of the substrate 110 may also be greatly increased. As a result, the electronic device 100 may be configured to realize the requirement of the high productivity.

Figure 2A:
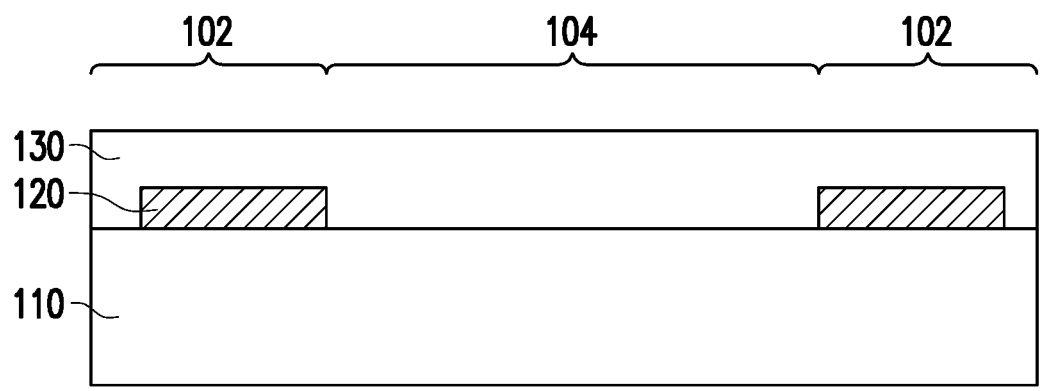
FIG. 2A to FIG. 2E are schematic diagrams of some steps of a method of fabricating an electronic device according to some embodiments of the disclosure in a cross-section view.

FIG. 2A to FIG. 2E are schematic diagrams of some steps of a method of fabricating an electronic device according to some embodiments of the disclosure. Structures shown in FIG. 2A to FIG. 2E correspond to a cross-sectional view along a line I-I in FIG. 1; however, the method of fabricating the electronic device is not limited thereto. In FIG. 2A, the substrate 110 is first provided. A first metal layer 120 is formed on the substrate 110, and a first insulation layer 130 is formed on the first metal layer 120. The first metal layer 120 may be distributed in the element areas 102 to establish a required electrical transmission path in the element areas 102. In some embodiments, a method of fabricating the first metal layer 120 may include depositing a metal material on the substrate 110 and patterning the metal material to form the first metal layer 120. A method of patterning the metal material may include photolithography or other replaceable method.

A method of fabricating the first insulation layer 130 may include forming an insulation material on the substrate 110 so that the insulation material covers the first metal layer 120 and covers the substrate 110. The first insulation layer 130 may completely cover an area of the substrate 110. In some embodiments, the insulation material of the first insulation layer 130 may include an ajinomoto build-up film (ABF) adhesive, epoxy, a molding compound, other build up materials, and the like; however, the disclosure is not limited thereto. In some embodiments, the first insulation layer 130 may be a thin film fabricated in advance, and the first insulation layer 130 may be attached to the substrate 110 in a bonding manner and cover the first metal layer 120. In addition, the first insulation layer 130 in a shape of a thin film is soft enough to extend along an outline of the first metal layer 120. In some embodiments, the first insulation layer 130 may include matrix and a filling material distributed in the matrix. The filling material includes, for example, a silicon dioxide filling material, glass fiber, and the like.

Figure 2B:
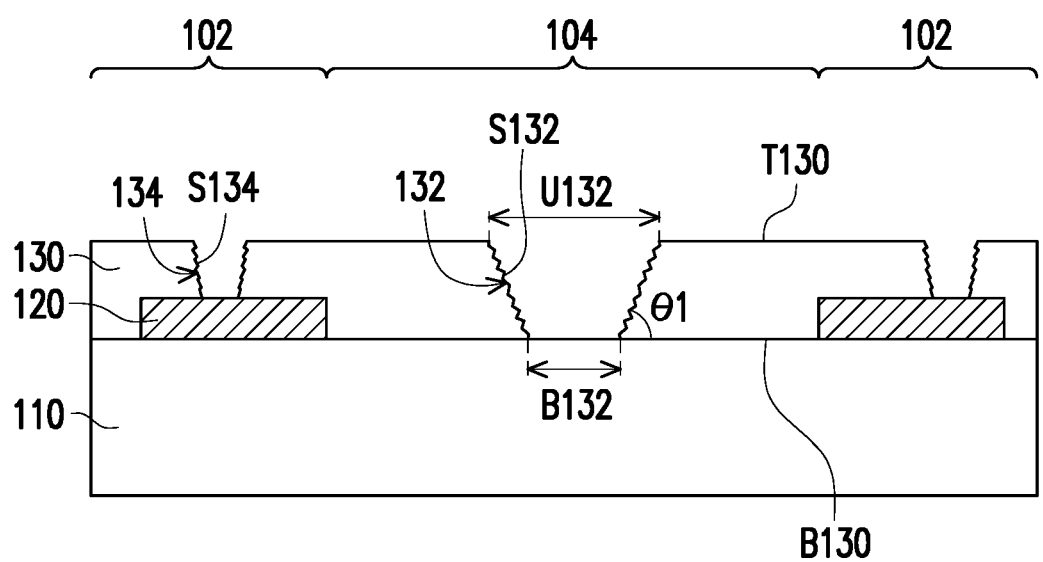

In FIG. 2B, next, the first insulation layer 130 is patterned to form a first opening 132 and a first hole 134. In the description, the term "hole" may be understood as a structure that is formed in the element areas 102 after patterning the insulation layer and may be filled with and/or covered by a further film layer, and the term "opening" may be understood as a structure that is formed in the non-element areas 104 after patterning the insulation layer and may be exposed in a further process; however, the disclosure is not limited thereto. A method of patterning the first insulation layer 130 includes laser drilling. In some embodiments, a laser beam of laser drilling may have a wavelength ranging from 266 nm to 355 nm; however, the disclosure is not limited thereto. Specifically, parameters such as energy or a focal length of the laser beam of laser drilling may be adjusted according to a film layer that is patterned and a pattern that is expected to be formed. After laser drilling, a cleaning process is performed to clean remaining detritus. In the cleaning process, for example, the remaining detritus is cleaned by using plasma or a suitable detergent. In some embodiments, before executing laser drilling, flatness of the device may be first inspected. For example, the flatness of the entire device is inspected by adopting an automated optical inspection (AOI) system. In this way, laser drilling may be executed in an area that is relatively not flat to form the first opening 132. In other words, a position of the first opening 132 may be adjusted according to an actual state of the device. In addition, the first hole 134 is located on the first metal layer 120 to expose a portion of the first metal layer 120.

In some embodiments, the first insulation layer 130 that undergoes laser drilling may have a rough surface. Hence, a sidewall S132 of the first insulation layer 130 at the first opening 132 and a sidewall S134 of the first insulation layer 130 at the first hole 134 may have roughness different from roughness of a top surface T130 of the first insulation layer 130. Specifically, the sidewall S132 and the sidewall S134 are rougher than the top surface T130. Namely, the roughness of the sidewall S134 of the first insulation layer 130 at the first hole 134 is greater than the roughness of the top surface T130 of the first insulation layer 130, and the roughness of the sidewall S132 of the first insulation layer 130 at the first opening 132 is greater than the roughness of the top surface T130 of the first insulation layer 130. In some embodiments, surface roughness of the sidewall S132 and surface roughness of the sidewall S134 may be 1500 nm to 6000 nm, and surface roughness of the top surface T130 may be 600 nm to 1300 nm. In addition, an outline of the first opening 132 and an outline of the first hole 134 may be in a shape of an inverted trapezoid in a cross section view. For example, a width B132 of a lower bottom of the first opening 132 is less than a width U132 of an upper bottom of the first opening 132, and a width of a lower bottom of the first hole 134 is less than a width of an upper bottom of the first hole 134. The sidewall S132 of the first insulation layer 130 at the first opening 132 and the sidewall S134 of the first insulation layer 130 at the first hole 134 may be approximately arc-shaped in a cross-sectional view, but they can also be a straight line. In addition, an included angle θ1 between the sidewall S132 of the first insulation layer 130 at the first opening 132 and a bottom surface B130 of the first insulation layer 130 may be greater than 30 degrees and less than or equal to 75 degrees. At the same time, the first hole 134 may have a similar inclined sidewall. In some embodiments, since laser drilling is adopted, a surface of the sidewall S132 and a surface of the sidewall S134 may have a scorch material, but the scorch material may be removed in the cleaning process. For example, the scorch material may include carbon. In some embodiments, the sidewall S132 and the sidewall S134 can be analyzed using a scanning electron microscope (SEM) or an energy dispersive spectroscopy (EDS) to determine the component of the scorch material. For example, through the image of the sidewall S132 or the sidewall S134 captured by SEM, debris separated from the body of the first insulation layer 130 may be seen and the material of the debris analyzed by using the EDS includes carbon.

Figure 2C:
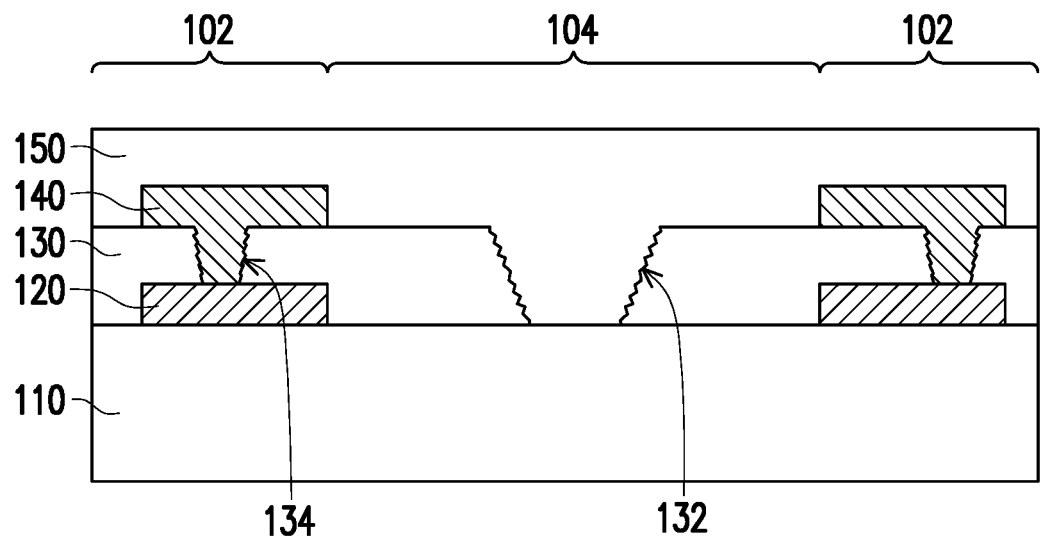

In FIG. 2C, a second metal layer 140 and a second insulation layer 150 may be subsequently formed on the first insulation layer 130. A method of fabricating the second metal layer 140 is similar to the method of fabricating the first metal layer 120, and a layout of the second metal layer 140 may be different from a layout of the first metal layer 120 to realize a required electrical transmission path. At least a portion of the second metal layer 140 is located in the first hole 134 and electrically connected to the first metal layer 120 through the first hole 134. A method of forming the second insulation layer 150 is similar to a method of forming the first insulation layer 130. The second insulation layer 150 covers the second metal layer 140 and covers the first insulation layer 130 beyond the second metal layer 140. Hence, the second metal layer 140 is located between the first insulation layer 130 and the second insulation layer 150. In addition, the second insulation layer 150 may extend to the first opening 132 of the first insulation layer 130 to contact the substrate 110 below the first insulation layer 130. A material of the second insulation layer 150 may be similar to or the same as a material of the first insulation layer 130.

Figure 2D:
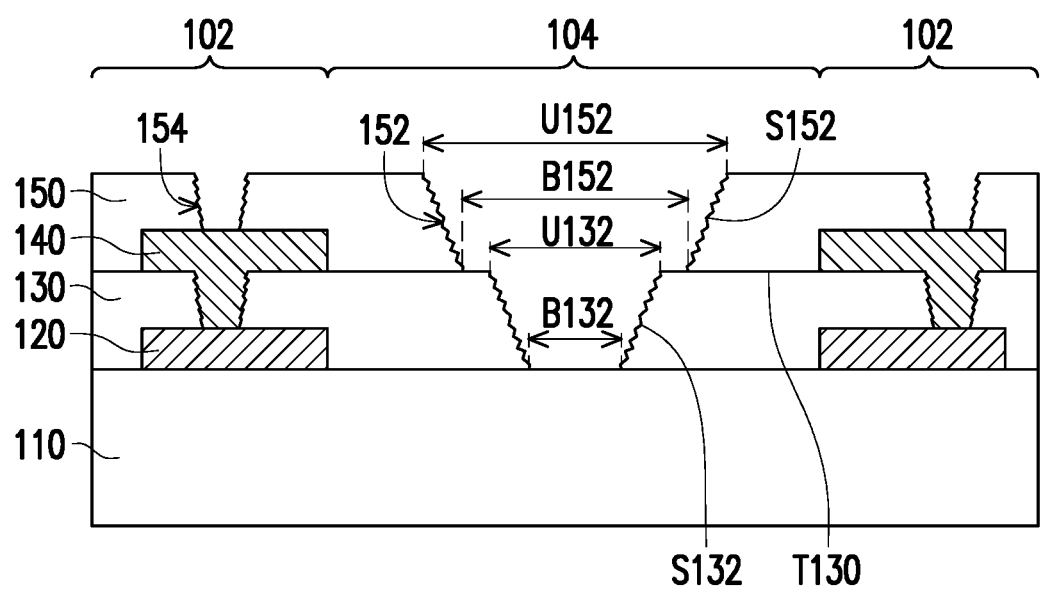

In FIG. 2D, the second insulation layer 150 is patterned to form a second opening 152 and a second hole 154. In some embodiments, a method of patterning the second insulation layer 150 may be similar to the method of patterning the first insulation layer 130. The second hole 154 may expose a portion of the second metal layer 140 to provide a path for mutual electrical connection of the second metal layer 140 and a metal layer that is further formed. The second opening 152 corresponds to the first opening 132, and the second opening 152 exposes the first opening 132.

In the embodiment, the second opening 152 has an outline in the shape of an inverted trapezoid that is similar to the outline of the first opening 132, and a size of the second opening 152 is greater than a size of the first opening 132. Hence, the second opening 152 may expose the first insulation layer 130 at the sidewall S132 of the first opening 132. For example, a width B152 of a lower bottom of the second opening 152 may be less than a width U152 of an upper bottom of the second opening 152, and the width B152 of the lower bottom of the second opening 152 may be greater than the width U132 of the upper bottom of the first opening 132. That is, a minimum of a width of the second opening 152 may be greater than a maximum of a width of the first opening 132. In this way, the first opening 132 and the second opening 152 may be connected to form a through hole with a stair-shaped (or step-shaped) outline. For example, the sidewall S132 of the first opening 132, the top surface T130 of the first insulation layer 130 and the sidewall S152 of the second opening 152 form a stair-shaped (or step-shaped) outline which defines the through hole passing through the first insulation layer 130 and the second insulation layer 150.

Figure 2E:
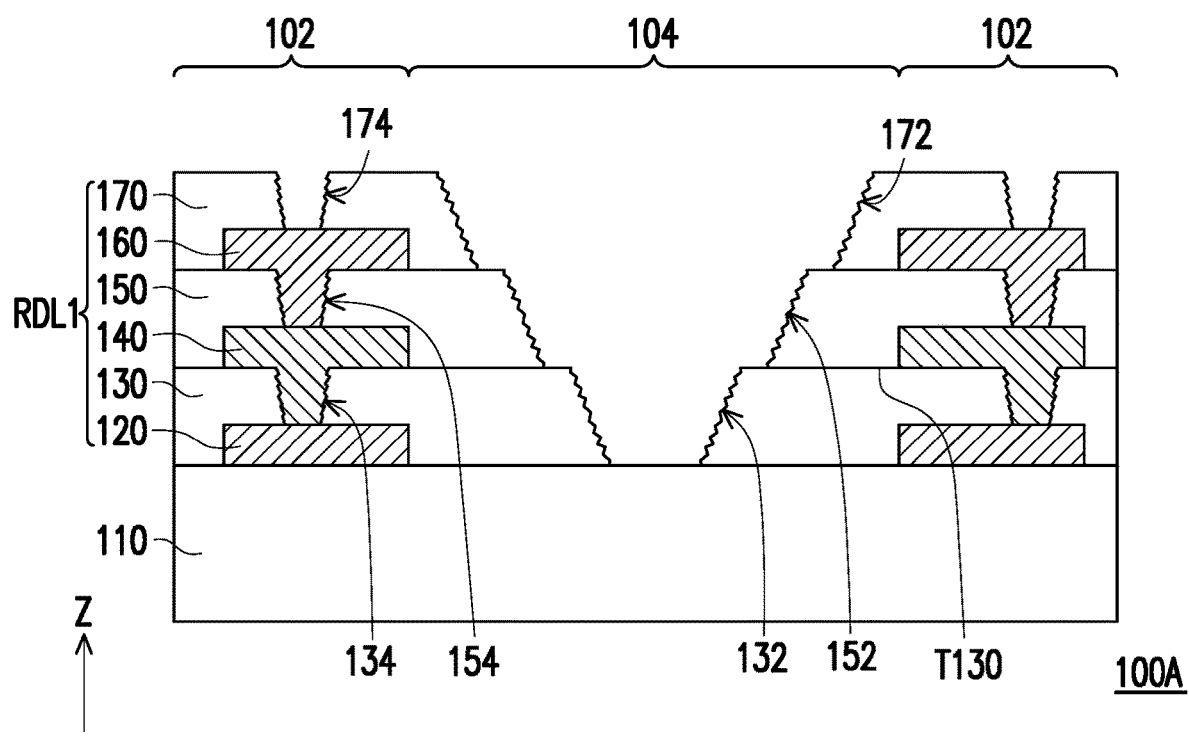

In FIG. 2E, after the step of FIG. 2D, a third metal layer 160 and a third insulation layer 170 are further sequentially formed on the second insulation layer 150 to form a connection element RDL1 of an electronic device 100A. The first insulation layer 130, the first metal layer 140, the second insulation layer 150, the third metal layer 160 and the third insulation layer 170 may be stack in sequence on the substrate 110 along a Z direction which is the normal direction of the electronic device 100A. A method of fabricating the third metal layer 160 is similar to the method of fabricating the first metal layer 120 and the second metal layer 140, and a method of fabricating the third insulation layer 170 is similar to the method of fabricating the first insulation layer 130 and the second insulation layer 150. For example, the third metal layer 160 may extend to the second hole 154 of the second insulation layer 150, and the third insulation layer 170 may be patterned to have a third opening 172. The third metal layer 160 is electrically connected to the second metal layer 140 through the second hole 154. The third opening 172 of the third insulation layer 170 exposes the second opening 152 of the second insulation layer 150. In the embodiment, a size of the third opening 172 is greater than the size of the second opening 152. For example, a minimum of a width of the third opening 172 is greater than a maximum of the width of the second opening 152, and the third opening 172 exposes a sidewall of the second insulation layer 150 at the second opening 152. Hence, the first opening 132, the second opening 152, and the third opening 172 may form a through hole with a stair-shaped outline.

In FIG. 2E, the electronic device 100A includes the connection element RDL1. The connection element RDL1 includes multiple insulation layers, such as the first insulation layer 130 and the second insulation layer 150. The first insulation layer 130 has the first opening 132. The sidewall S132 of the first insulation layer 130 at the first opening 132 has the roughness different from the roughness of the top surface T130 of the first insulation layer 130. The second insulation layer 150 is disposed on the first insulation layer 130 and has the second opening 152. The second opening 152 exposes the first insulation layer 130 at the sidewall S132 of the first opening 132. In a process of fabricating the electronic device 100A, if stress occurs, the first opening 132 and the second opening 152 may provide a channel to release the stress, preventing structural deformation or warpage caused by the stress in the fabricating process. As a result, a yield in the process of fabricating the electronic device 100A may be enhanced due to the first opening 132 and the second opening 152.

In some embodiments, when fabricating the electronic device 100A, positions of the first opening 132, the second opening 152, and the third opening 172 may be set in advance. In some embodiments, the positions of the first opening 132, the second opening 152, and the third opening 172 may be adjusted according to an actual state of the device. For example, before each insulation layer is fabricated, flatness of the entire device is inspected, and the positions of the first opening 132, the second opening 152, and the third opening 172 are determined according to an inspection result. For example, before the insulation layer is fabricated, the flatness of the entire device may be inspected by adopting the automated optical inspection system. In addition, the first opening 132, the second opening 152, and the third opening 172 may be disposed at positions where warpage occurs or relatively severe warpage occurs according to the inspection result. In this way, in a further process, inaccurate positioning or uneven film thickness due to warpage of the structure may not occur. In some embodiments, if the flatness inspection result shows that there is no obvious warpage or deformation, a buffer opening may not be formed on a corresponding insulation layer.

The connection element RDL1 may serve as the redistribution layer of the element to provide a required conducting transmission path. In one embodiment, the redistribution layer may include thin film transistor, ESD, capacitance or other active element, but not limited to. Specifically, the connection element RDL1 further includes the first metal layer 120, the second metal layer 140, and the third metal layer 160. The first metal layer 120 is disposed between the substrate 110 and the first insulation layer 130. The second metal layer 140 is disposed between the first insulation layer 130 and the second insulation layer 150. The third metal layer 160 is disposed between the second insulation layer 150 and the third insulation layer 170. The first hole 134 of the first insulation layer 130 exposes a portion of the first metal layer 120. The second metal layer 140 may extend to the first hole 134 of the first insulation layer 130 to be electrically connected to the first metal layer 120. Similarly, the third metal layer 160 may extend to the second hole 154 of the second insulation layer 150 to be electrically connected to the second metal layer 140. In addition, a third hole 174 of the third insulation layer 170 may expose a portion of the third metal layer 160. A layer number of metal layers and a layer number of insulation layers may be adjusted according to required layout planning. In FIG. 2E, for example, four metal layers and four insulation layers are taken as an example for description.

In addition, although it is not shown in the drawings, the electronic device 100A may further include an electronic element, such as a semiconductor chip. The semiconductor chip may be disposed on the substrate 110 and electrically connected to the connection element RDL1. The semiconductor chip may be connected to the substrate 110 after the fabrication of the connection element RDL1 is completed, which means that a fabricating method of RDL first is adopted. In some embodiments, the semiconductor chip disposed on the substrate 110 may be a die of chip packaging. Hence, the electronic device 100A may further include a packaging material that is not shown, such as a molding compound, and the packaging material includes the semiconductor chip.

Figure 3A:
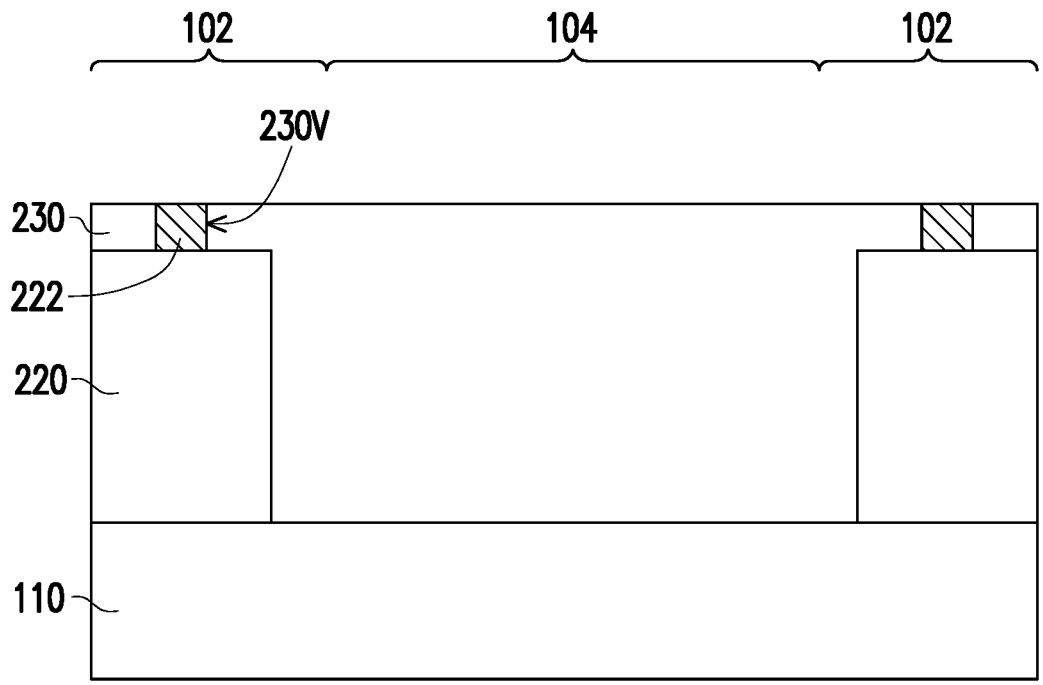
FIG. 3A to FIG. 3E are schematic diagrams of some steps of a method of fabricating an electronic device according to some embodiments of the disclosure in a cross-section view.

FIG. 3A to FIG. 3E are schematic diagrams of some steps of a method of fabricating an electronic device according to some embodiments of the disclosure. Structures shown in FIG. 3A to FIG. 3E correspond to a cross-sectional view of the electronic device along the line I-I in FIG. 1; however, the method of fabricating the electronic device is not limited thereto. In FIG. 3A, the substrate 110 is provided. A semiconductor chip 220 is attached to the substrate 110, and a first insulation layer 230 is formed on the substrate 110. The semiconductor chip 220 may be attached to the substrate 110 through an adhesion layer (not shown), and corresponding to a layout of FIG. 1, the semiconductor chip 220 may be located in the element areas 102. The non-element areas 104 are present between the adjacent element areas 102. In some embodiments, the semiconductor chip 220 may be attached to the substrate 110 with an active surface facing upwards or attached to the substrate 110 with the active surface facing downwards. The first insulation layer 230 may encapsulate the semiconductor chip 220. In some embodiments, a material of the first insulation layer 230 may include a packaging material, such as a molding compound, epoxy, and the like. In some embodiments, the first insulation layer 230 may include matrix and a filling material distributed in the matrix. In addition, when the first insulation layer 230 is formed, an insulation material of the first insulation layer 230 may first completely cover the semiconductor chip 220. Then, a polishing process is performed to expose a bonding element 222 on the semiconductor chip 220. Hence, the first insulation layer 230 may have a first hole 230V so that the bonding element 222 on the semiconductor chip 220 may penetrate the first insulation layer 230 and be exposed. However, it is not necessary to adopt an additional process to fabricate the first hole 230V.

Figure 3B:
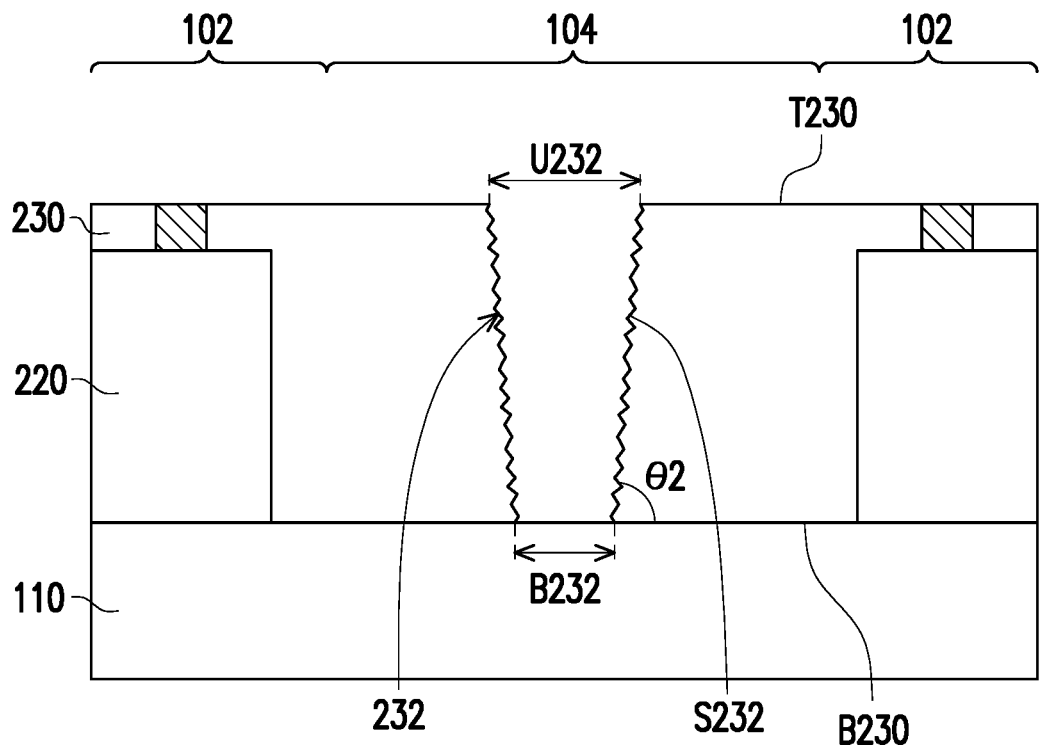

In FIG. 3B, next, the first insulation layer 230 is patterned to form a first opening 232 in the non-element areas 104. In the embodiment, a method of patterning the first insulation layer 230 may include laser drilling. In other words, a method of forming the first opening 232 is similar to the method of forming the first opening 132. Hence, in the embodiment, after the first insulation layer 230 is patterned through laser drilling, a cleaning process is further performed to remove detritus generated in the process of laser drilling. In the embodiment, the first opening 232 formed through laser drilling may have an outline in the shape of an inverted trapezoid. A width B132 of a lower bottom of the first opening 232 is less than a width U232 of an upper bottom of the first opening 232. In the embodiment, roughness of a sidewall S232 of the first insulation layer 230 at the first opening 232 may be greater than roughness of a top surface T230 of the first insulation layer 230. In some embodiments, surface roughness of the sidewall S232 may be 1500 nm to 6000 nm, and surface roughness of the top surface T230 may be 600 nm to 1300 nm. In addition, an included angle θ2 between the sidewall S232 of the first insulation layer 230 at the first opening 232 and a bottom surface B230 of the first insulation layer 230 may be greater than 30 degrees and less than or equal to 75 degrees. The angle range of the sidewall S232, the rough surface of the sidewall S232, or a combination thereof may enhance the attaching between the metal material subsequently formed and the first insulation layer 230. In some embodiments, since laser drilling is adopted, a surface of the sidewall S232 may have a scorch material, but the scorch material may be removed in the cleaning process. Similar to the sidewall S132, the scorch material may include carbon, but the disclosure is not limited thereto.

Figure 3C:
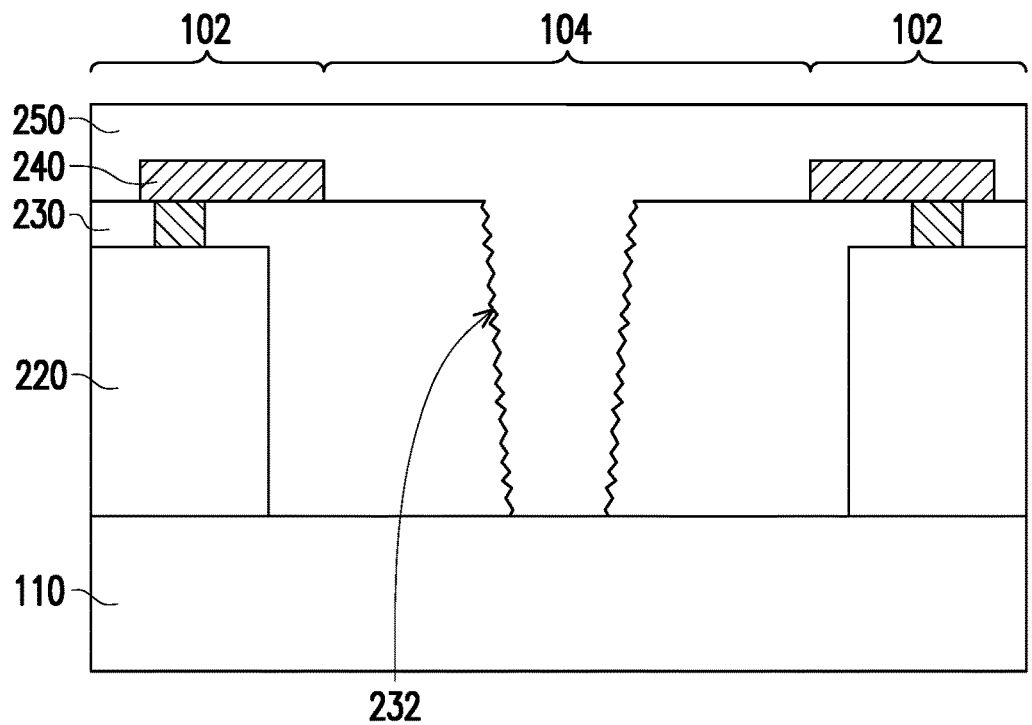

In FIG. 3C, a first metal layer 240 and a second insulation layer 250 are sequentially formed on the first insulation layer 230. For a method of forming the first metal layer 240, the description of a method of forming the first metal layer 120 in the previous embodiments may be referred to. The first metal layer 240 may be electrically connected to the semiconductor chip 220 through the corresponding bonding element 222. The second insulation layer 250 may be entirely formed on the substrate 110 to cover the first metal layer 240 and the first insulation layer 230. For example, in a process of FIG. 3C, the second insulation layer 250 may extend into the first opening 232 to contact the substrate 110.

Figure 3D:
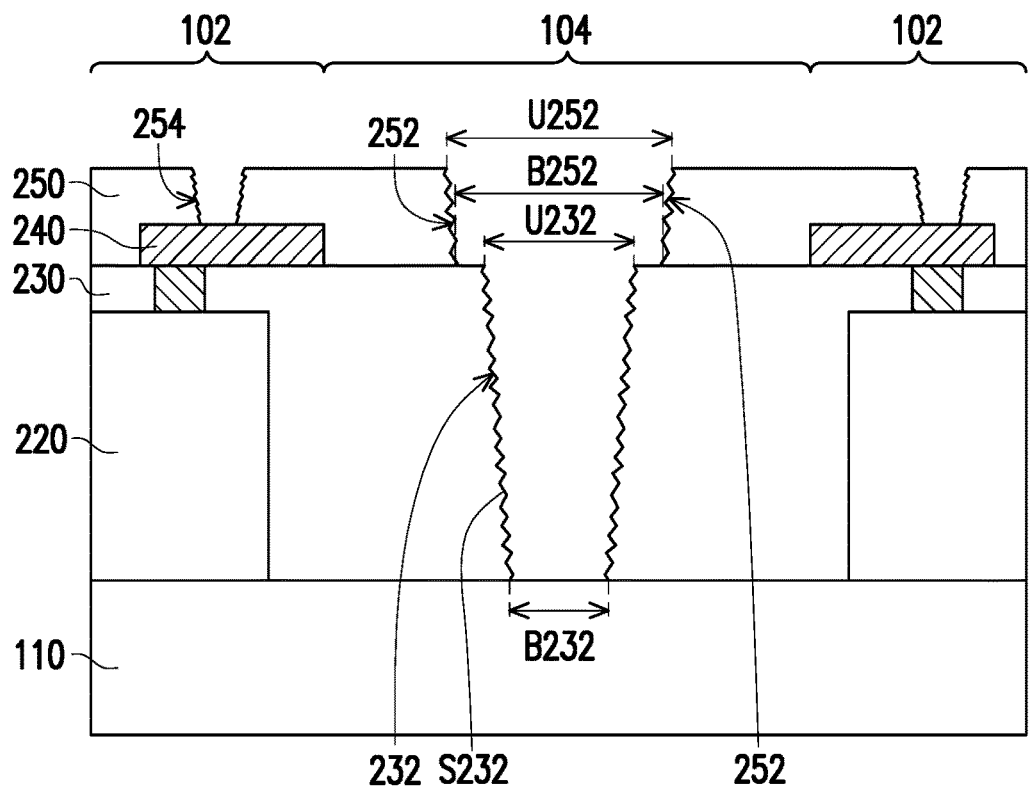

Next, in FIG. 3D, the second insulation layer 250 is patterned to form a second opening 252 and a second hole 254. A method similar to the method of patterning the first insulation layer 130 in the previous embodiments may be adopted to pattern the second insulation layer 250. In the embodiment, the second opening 252 may penetrate the first opening 232 to form a through hole. A size of the second opening 252 may be greater than a size of the first opening 232 so that the sidewall S232 of the first insulation layer 230 at the first opening 232 may be completely exposed. For example, a width B252 of a lower bottom of the second opening 252 may be less than a width U252 of an upper bottom of the second opening 252, and the width B252 of the lower bottom of the second opening 252 may be greater than the width U232 of the upper bottom of the first opening 232. That is, a minimum of a width of the second opening 252 may be greater than a maximum of a width of the first opening 232. In this way, the first opening 232 and the second opening 252 may be connected to form a through hole with a stair-shaped outline.

Figure 3E:
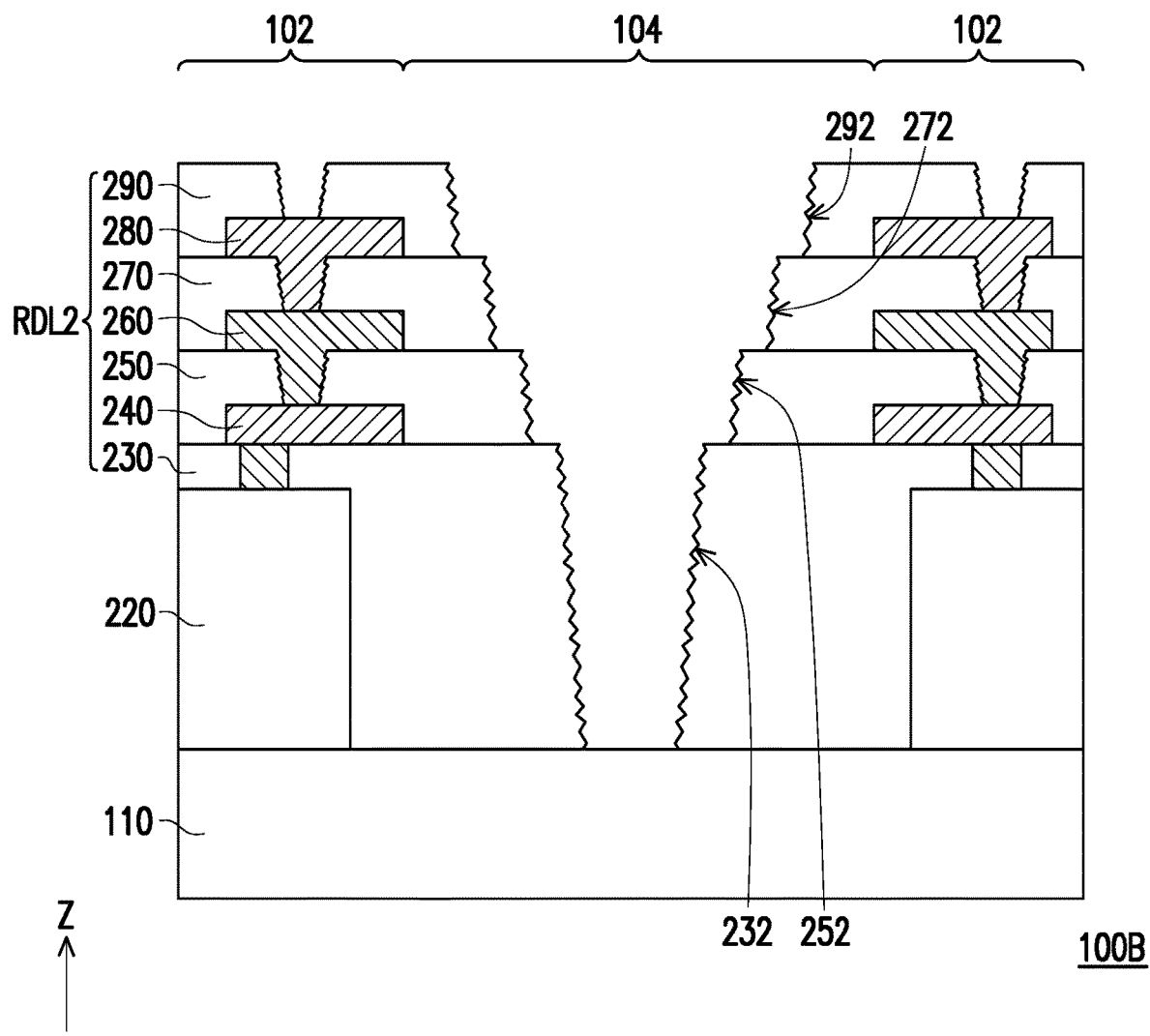

In FIG. 3E, a second metal layer 260, a third insulation layer 270, a third metal layer 280, and a fourth insulation layer 290 are sequentially formed on the second insulation layer 250 to form an electronic device 100B having a connection element RDL2. The first insulation layer 230, the first metal layer 240, the second insulation layer 250, the second metal layer 260, the third insulation layer 270, the third metal layer 280, and the fourth insulation layer 290 may be stack in sequence on the substrate 110 along a Z direction which is the normal direction of the electronic device 100B. The connection element RDL2 may serve as a redistribution layer to realize a required electrical transmission path of the semiconductor chip 220. In the embodiment, the connection element RDL2 is fabricated after the semiconductor chip 220 is attached to the substrate 110. Hence, it may be understood that a fabricating method of chip first is adopted; however, the disclosure is not limited thereto. Here, for a method of fabricating the second metal layer 260 and the third metal layer 280, the description of the previous embodiments may be referred to. A method of fabricating the third insulation layer 270 and the fourth insulation layer 290 is similar to the method of fabricating the first insulation layer 230 and the second insulation layer 250. The third insulation layer 270 may be patterned to have a third opening 272, and the fourth insulation layer 290 may be patterned to have a fourth opening 292. The third opening 272 penetrates the first opening 232 and the second opening 252, and the fourth opening 292 penetrates the first opening 232, the second opening 252, the third opening 272 to form a through hole. In addition, since an opening that is farther away from the substrate 110 has a larger size, the through hole formed through the fourth opening 292 penetrating the first opening 232, the second opening 252, and the third opening 272 has a stair-shaped outline.

The first opening 232, the second opening 252, the third opening 272, and the fourth opening 292 may serve as a buffer structure. For example, with the first opening 232, the second opening 252, the third opening 272, and the fourth opening 292, in a process of fabricating the electronic device 100B, stress generated due to a change in temperature or pressure may be released so that it is not likely to cause warpage of the substrate 110. As a result, in the process of fabricating the electronic device 100B, favorable flatness may be maintained so that accuracy of a patterning process may be enhanced to increase a yield in the fabricating process.

In summary of the above, in the electronic device and the method of fabricating the electronic device in the embodiments of the disclosure, the insulation layer in the connection element may be separated to provide a buffer. Therefore, in the fabricating process, the warpage of the electronic device due to the stress is not likely to occur so that the yield in the fabricating process of the electronic device may be increased.

Lastly, it is to be noted that: the embodiments described above are only used to illustrate the technical solutions of the disclosure, and not to limit the disclosure; although the disclosure is described in detail with reference to the embodiments, those skilled in the art should understand: it is still possible to modify the technical solutions recorded in the embodiments, or to equivalently replace some or all of the technical features; the modifications or replacements do not cause the essence of the corresponding technical solutions to deviate from the scope of the technical solutions of the embodiments.

What is claimed is:
1. A method of fabricating an independent electronic device from an electronic device having a plurality of element areas and a plurality of non-element areas, the plurality of non-element areas includes scribe lines, the method comprising:
  providing a panel level glass substrate;

forming a first metal layer only on the plurality of element areas of the panel level glass substrate;
forming a first insulation layer on the panel level glass substrate of both the plurality of element areas and the plurality of non-element areas;
patterning the first insulation layer to form a first opening in the plurality of non-element areas;
forming a second insulation layer on the first insulation layer, wherein the second insulation layer extends to the first opening, and in a cross-sectional view, a width of a lower bottom of the first opening is less than a width of an upper bottom of the first opening; and
patterning the second insulation layer to form a second opening corresponding to the first opening,
wherein the second opening exposes a portion of a surface of the first insulation layer, the first opening and the second opening expose the panel level glass substrate, a width of a lower bottom of the second opening is less than a width of an upper bottom of the second opening and the width of the lower bottom of the second opening is greater than the width of the upper bottom of the first opening; and
cutting the electronic device along the scribe lines to form the independent electronic device.

2. The method of fabricating the electronic device according to claim 1, wherein a method of patterning the first insulation layer comprises laser drilling.

3. The method of fabricating the electronic device according to claim 1, wherein the first insulation layer covers the first metal layer.

4. The method of fabricating the electronic device according to claim 3, wherein a method of patterning the first insulation layer further comprises forming a hole, wherein the first metal layer is exposed by the hole.

5. The method of fabricating the electronic device according to claim 1, wherein a method of patterning the first insulation layer to form a hole and the first opening comprises laser drilling.

6. A method of fabricating an independent electronic device from an electronic device having a plurality of element areas and a plurality of non-element areas, the plurality of non-element areas includes scribe lines, the method comprising:

providing a panel level glass substrate;
providing a plurality of semiconductor chips only on the panel level glass substrate in the plurality of element areas;
forming a first insulation layer on the panel level glass substrate and surrounding the plurality of semiconductor chips;
patterning the first insulation layer to form a first opening in the plurality of non-element areas;
forming a second insulation layer on the first insulation layer;
patterning the second insulation layer to form a second opening corresponding to the first opening, wherein, in a cross-sectional view, the second opening exposes a portion of a surface of the first insulation layer, a width of a lower bottom of the first opening is less than a width of an upper bottom of the first opening, and the width of the upper bottom of the first opening is less than a width of a lower bottom of the second opening; and
cutting the electronic device along the scribe lines to form the independent electronic device,
wherein the first opening and the second opening expose the panel level glass substrate, and the first opening and the second opening do not overlap the plurality of the semiconductor chips.

7. The method of fabricating the electronic device according to claim 6, wherein a method of patterning the first insulation layer and a method of patterning the second insulation layer comprise laser drilling.

8. The method of fabricating the electronic device according to claim 6, wherein a first metal layer is further formed on the panel level glass substrate, and the first insulation layer covers the first metal layer.

9. The method of fabricating the electronic device according to claim 8, wherein a method of patterning the first insulation layer further comprises forming a hole, wherein the first metal layer is exposed by the hole, and a method of forming the hole and a method of forming the first opening comprise laser drilling.

* * * * *